United States Patent [19]
Stewart et al.

[11] Patent Number: 5,813,113
[45] Date of Patent: Sep. 29, 1998

[54] FIXTURE FOR MAKING LAMINATED INTEGRATED CIRCUIT DEVICES

[75] Inventors: Gary L. Stewart, Lake Worth; Milo Dunaj, Boca Raton, both of Fla.

[73] Assignee: International Business Machines Corporation, Armonk, N.Y.

[21] Appl. No.: 762,361

[22] Filed: Dec. 9, 1996

[51] Int. Cl.[6] ............................... H05K 3/36; B23P 19/04
[52] U.S. Cl. .............................. 29/760; 29/759; 29/830; 269/903; 428/901
[58] Field of Search ............................ 29/738, 759, 760, 29/830; 156/391; 269/903; 428/901

[56] References Cited

U.S. PATENT DOCUMENTS

| | | | |
|---|---|---|---|
| 4,646,128 | 2/1987 | Carson et al. | 257/777 |
| 4,672,737 | 6/1987 | Carson et al. | 438/109 X |
| 4,704,319 | 11/1987 | Belanger et al. | 428/209 |
| 4,706,166 | 11/1987 | Go | 361/771 |
| 4,760,640 | 8/1988 | Lawrence | 29/760 |
| 4,764,846 | 8/1988 | Go | 29/830 X |
| 4,767,984 | 8/1988 | Bakker | 29/760 X |
| 4,932,857 | 6/1990 | Nishino et al. | 425/394 |
| 4,983,533 | 1/1991 | Go | 438/109 X |
| 5,045,685 | 9/1991 | Wall | 250/208.1 |
| 5,085,362 | 2/1992 | Art et al. | 29/760 X |
| 5,104,820 | 4/1992 | Go et al. | 438/109 |
| 5,107,586 | 4/1992 | Eichelberger et al. | 29/830 |
| 5,218,515 | 6/1993 | Bernhardt | 361/689 |
| 5,241,450 | 8/1993 | Bernhardt et al. | 361/689 |
| 5,279,991 | 1/1994 | Minahan et al. | 438/109 |
| 5,347,428 | 9/1994 | Carson et al. | 361/760 |
| 5,400,698 | 3/1995 | Savage | 425/383 X |
| 5,412,865 | 5/1995 | Takaoka et al. | 29/830 |
| 5,424,920 | 6/1995 | Miyake | 257/686 X |
| 5,432,318 | 7/1995 | Minahan | 219/385 |
| 5,432,729 | 7/1995 | Carson et al. | 257/686 X |
| 5,467,526 | 11/1995 | Kunkel et al. | 29/759 X |

FOREIGN PATENT DOCUMENTS

| | | | |
|---|---|---|---|
| 2577693 | 8/1986 | France | 29/760 |
| 834957 | 5/1981 | U.S.S.R. | 29/760 |
| 1609693A | 11/1990 | U.S.S.R. | |
| 974099 | 9/1962 | United Kingdom. | |

*Primary Examiner*—Peter Vo
*Attorney, Agent, or Firm*—Quarles & Brady

[57] ABSTRACT

A fixture for making laminated integrated circuit devices from layers of integrated circuits includes a base and at least two side body portions for substantially enclosing the sides of the laminating integrated circuit layers. The side body portions have inside surfaces for engaging the layers of integrated circuits so as to hold the layers in a desired alignment during curing. Structure is provided for retaining the side body portions in position so as to hold the layers in the desired alignment.

9 Claims, 6 Drawing Sheets

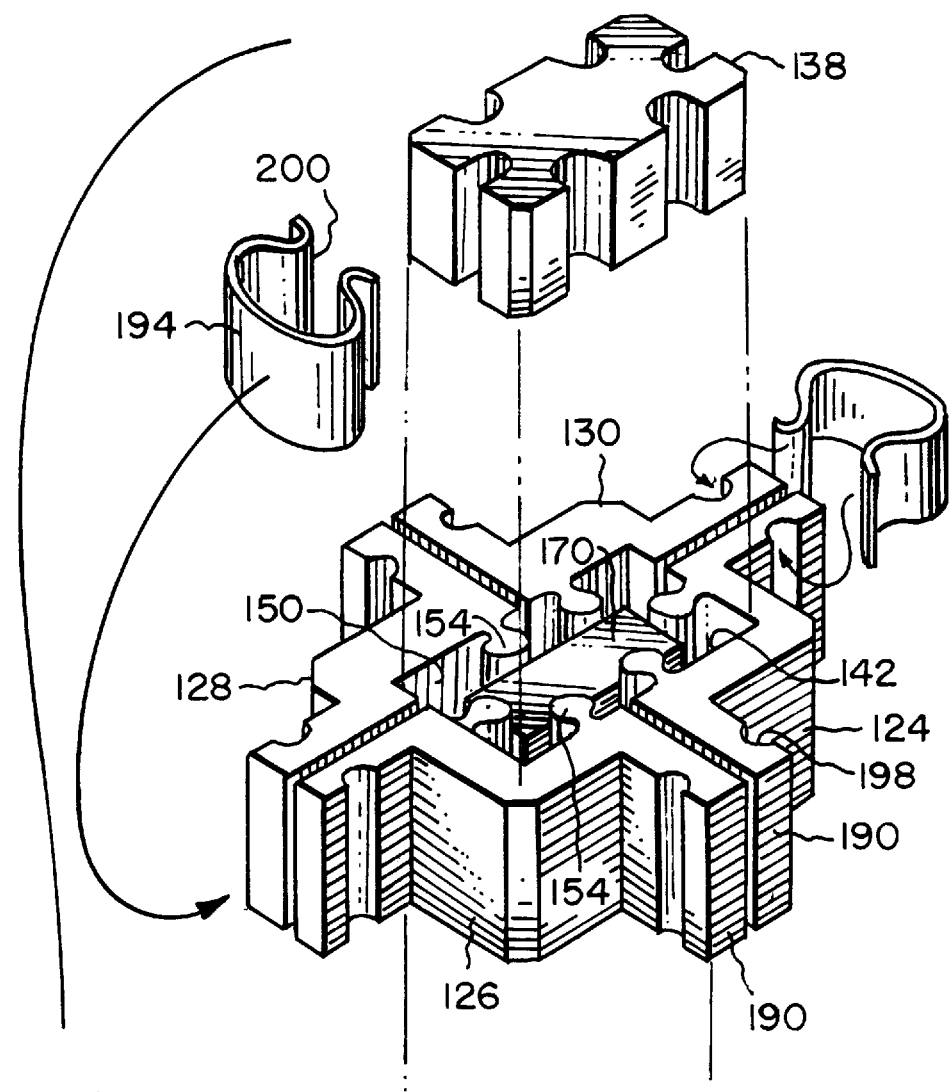
FIG. 11
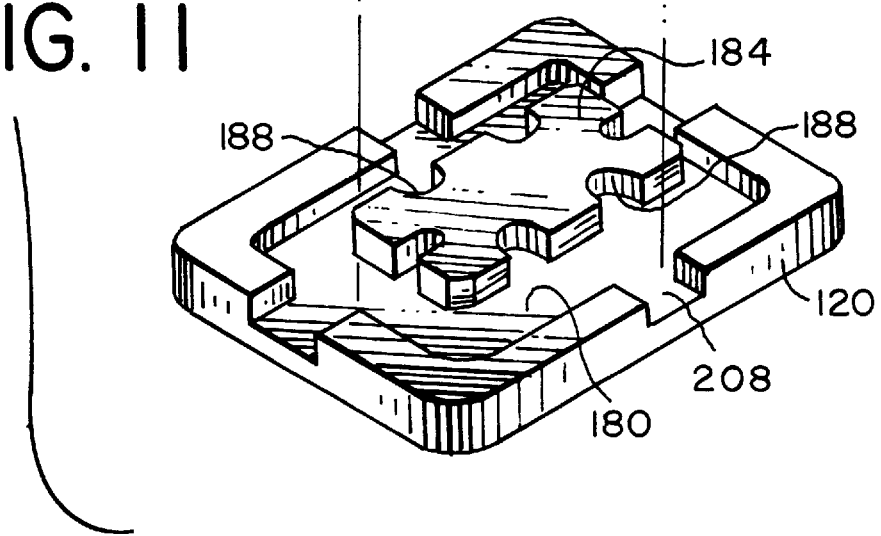

FIXTURE FOR MAKING LAMINATED INTEGRATED CIRCUIT DEVICES

BACKGROUND OF THE INVENTION

This invention relates generally to apparatus for making laminated integrated circuit devices (LICDs), and more particularly to fixtures for making laminated integrated circuit devices.

DESCRIPTION OF THE RELEVANT ART

The lamination of single layer integrated circuit chips into a multiple layer device, sometimes referenced by the art as a "cube", is used to package several of such chips in a convenient unit device. Such cubes are especially desirable where limited space is available, for example, on missiles and satellites, but they are also useful in other devices where space saving is desirable. The manufacture of such cubes typically utilizes an adhesive such as a polyimide to adhere the single layer chips together. The adhesive must be cured with heat, and preferably under a vacuum to remove air and other gases from between the circuit layers. Further, pressure is applied to the cube during curing to form a compact, tightly adhered structure.

It is necessary to retain the laminated integrated circuit layers in proper position during the curing process. It is also necessary to retain the laminated integrated circuit layers in position, to relatively tight tolerances, during the application of pressure to the layers. Also, the fixture must be capable of, or permit, the transference of heat to the layers for purposes of curing the adhesive which binds the layers together. Such fixtures should preferably also be capable of making adjustments for slightly different layer cross sectional areas, as well as different numbers of layers, resulting in different cube heights.

SUMMARY OF THE INVENTION

The invention provides a fixture for making laminated integrated circuit devices from layers of integrated circuits. The fixture has a base, and at least two side body portions. The side body portions substantially completely enclose the sides of the laminated integrated circuit layers. The side body portions have inside surfaces for engaging the layers of integrated circuits so as to hold the layers in a desired alignment. Structure is provided for retaining the side body portions in position so as to hold the layers in desired alignment. The structure is substantially open-topped, and a moveable cap can be provided which will rest on top of the laminated integrated circuit layers such that these layers will be substantially enclosed by the base, the side body portions, and the cap.

The inside surfaces of the side body portions preferably include protrusions for engagement of the layers of integrated circuits. These protrusions are preferably substantially vertically elongated. The inside surfaces preferably also have right angle portions, such that each side body portion will engage rectangular integrated circuit layers along at least two sides. The right angle portions can engage rectangular integrated circuit layers at substantially diagonally-opposite corners thereof. In this manner, the side body portions can be used with rectangular integrated circuit layers having differing sizes.

The base preferably includes support structure for positioning the side body portions in a desired position. A range of movement is preferably provided to allow for differently-sized integrated circuit layers. The support structure preferably comprises a depression, into which bottom edges of the side body portions are inserted. Grooves can also be provided to receive ends of the vertically elongated protrusions. These grooves are preferably dimensioned to permit some movement of the vertically-oriented protrusions, and thereby of the side body portions, to accommodate differently-sized circuit layers.

The structure for retaining the side body portions in position can be selected from any suitable engagement structure, but preferably is biased so as to cause the side body portions to firmly engage the circuit layers. The biasing structure can be a closed loop of elastic material, such as an elastic band, but preferably is a substantially circular spring. The elastic material can engage an outside surface of the side body portions at a groove that is provided in the side body portions to retain the biasing structure in position.

In an alternative embodiment, the side body portions include engagement portions substantially at ends thereof. Clips or other engagement structure are provided to secure the engagement portions of adjacent side body portions so as to retain the side body portions together. In a preferred embodiment, the engagement portions comprise outwardly extending engagement protrusions, having grooves for receiving the biased end of a spring clip.

BRIEF DESCRIPTION OF THE DRAWINGS

There are shown in the drawings embodiments which are presently preferred, it being understood, however, that the invention is not limited to the precise arrangements and instrumentalities shown, wherein:

FIG. 11 is an exploded perspective of a fixture according to an alternative embodiment of the invention.

DETAILED DESCRIPTION OF THE PREFERRED EMBODIMENTS

A preferred fixture according comprises a base 20, and at least two side body portions 24 and 28. Engagement structure 32 (FIG. 8) is provided to secure the side body portions 24, 28 together. A cap 38 can be provided to rest on top of a laminated integrated circuit device that is held in position between the base 20 and side body portions 24, 28.

Figure 8:
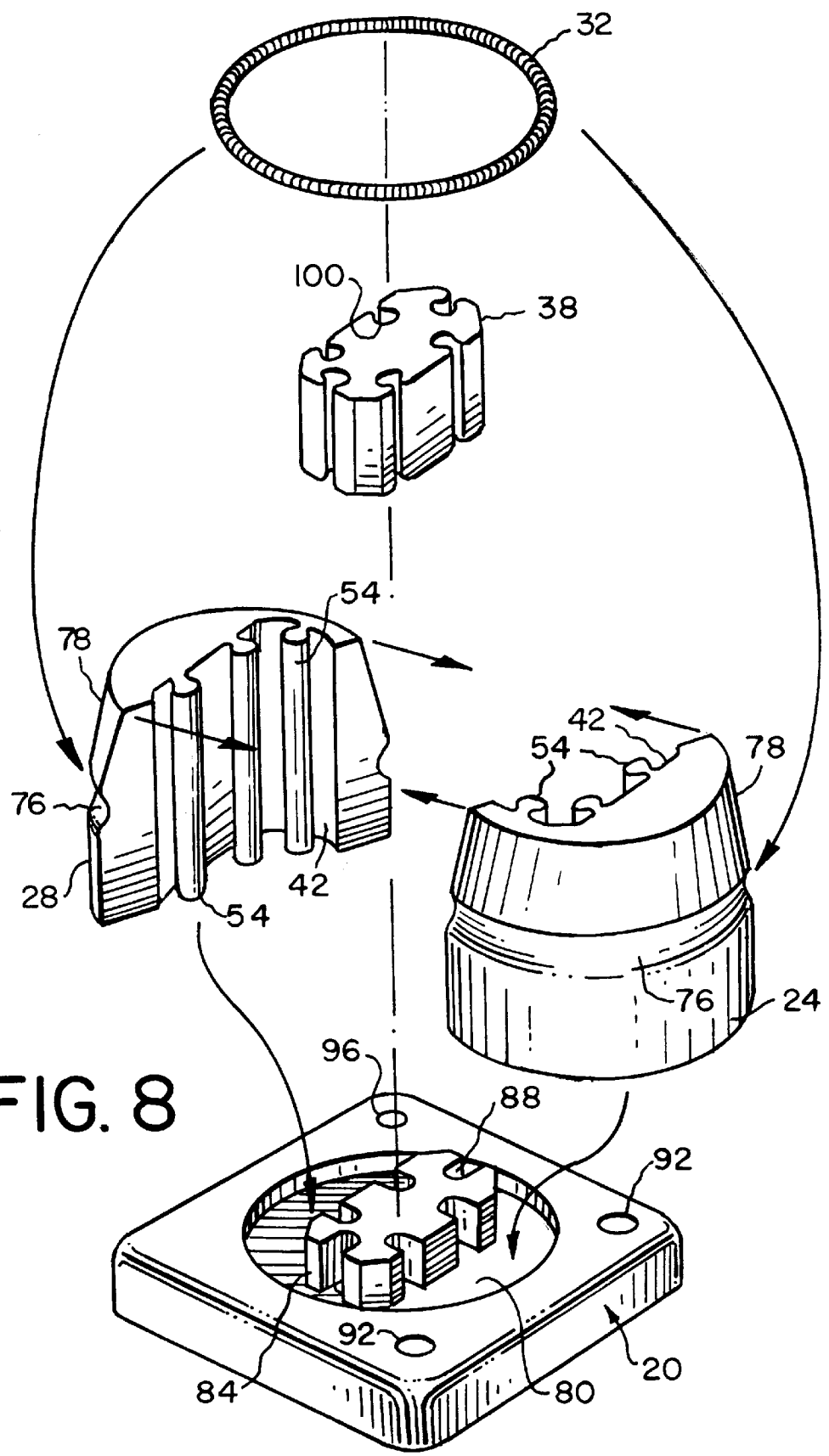
FIG. 8 is an exploded perspective of a fixture according to the invention.

There are preferably at least two side body portions. The side body portions can have different shapes, such as the substantially semicylindrical shape of the side body portions 24, 28. The side body portions are preferably separate, and are juxtaposed to form the fixture. The fixture shown is approximately cylindrical, although it will be appreciated that fixtures that are rectangular or more regular in shape are also possible. The inside surfaces 42 of the side body portions 24, 28 define an open interior space 50 when the side body portions are juxtaposed to form to form the fixture. The open interior space 50 defines the area where the laminated integrated circuit layers are held by the fixture during the curing process. Protrusions 54 are preferably provided on the inside surfaces 42. The protrusions can be provided in any suitable shape, but preferably provide a point contact against the cube to minimize heat transfer effects through the side body portions to cube. The protrusions 54 are preferably vertically elongated so as to contact all of the stacked circuit layers in the cube (FIG. 8).

Figure 1:
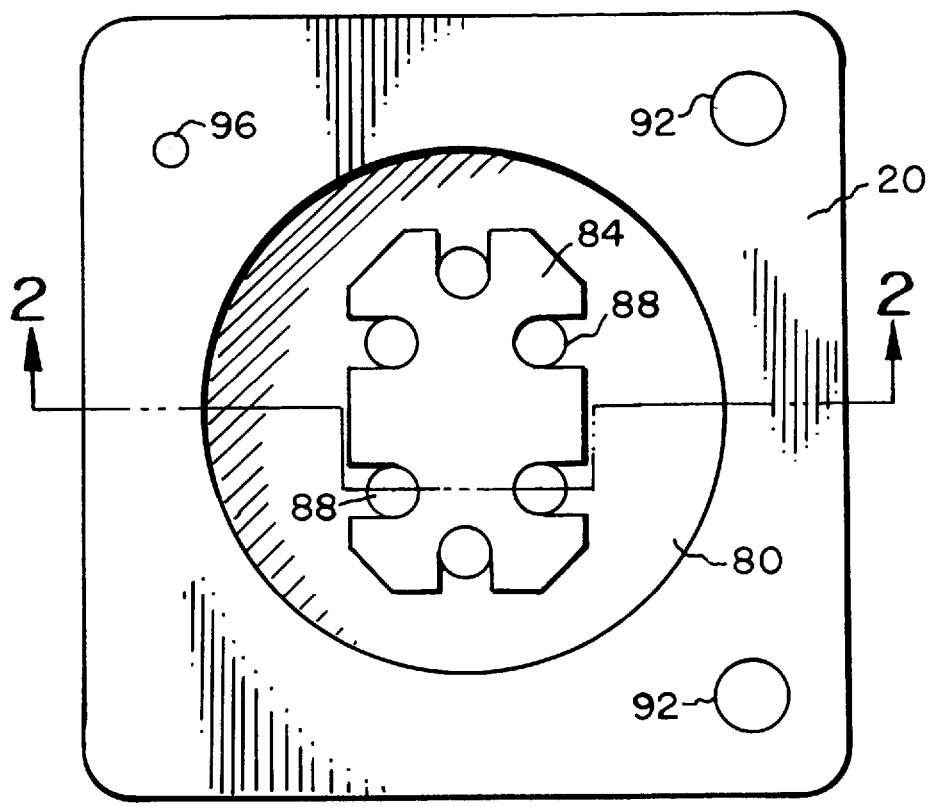
FIG. 1 is a top plan view of a base according to the invention.
Figure 2:
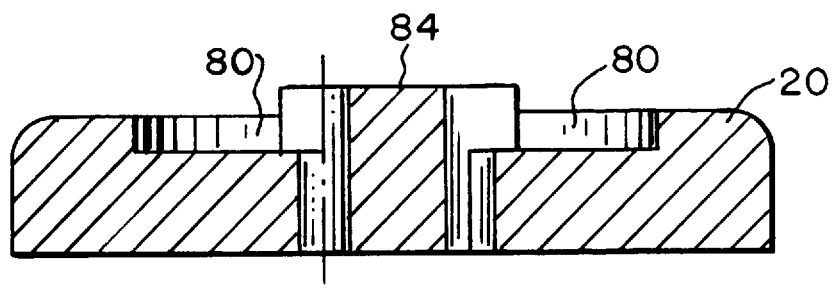
FIG. 2 is a cross section taken along line 2—2 in FIG. 1.
Figure 3:
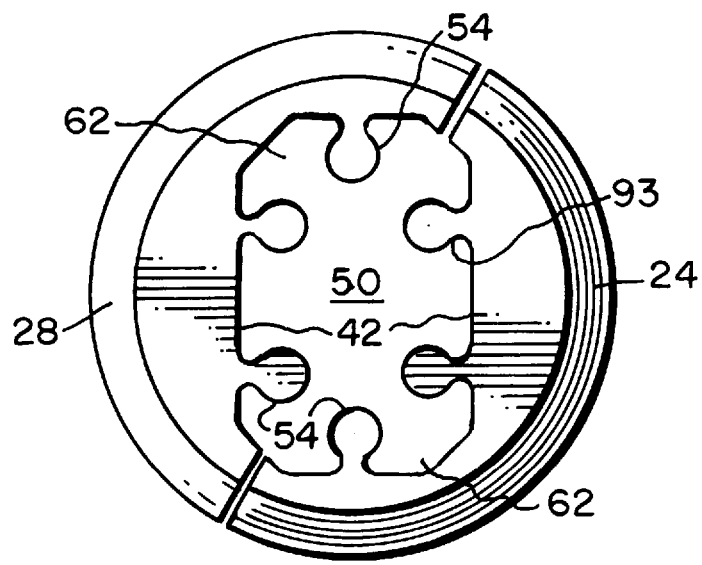
FIG. 3 is a top plan view of a fixture according to the invention.
Figure 4:
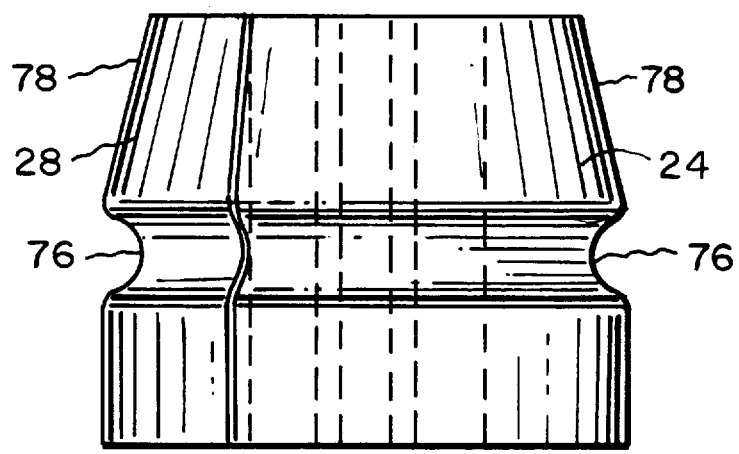
FIG. 4 is a side elevation.
Figure 5:
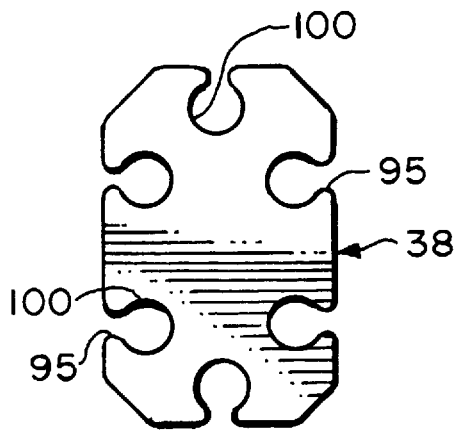
FIG. 5 is a plan view of a cap according to the invention.
Figure 6:
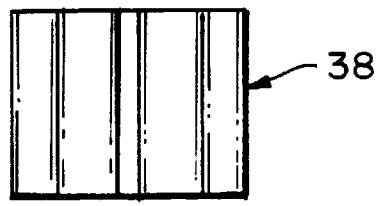
FIG. 6 is a side elevation.
Figure 7:
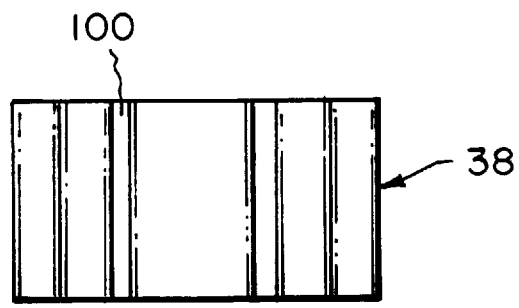
FIG. 7 is an front elevation.
Figure 10:
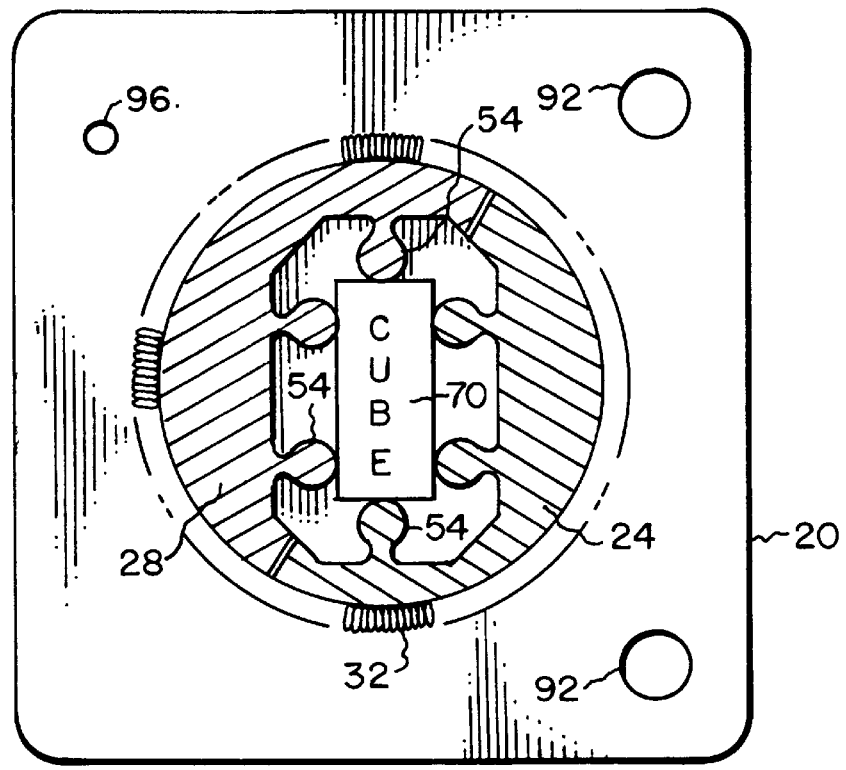
FIG. 10 is a cross section taken along the line 10—10 in FIG. 9.
Figure 9:
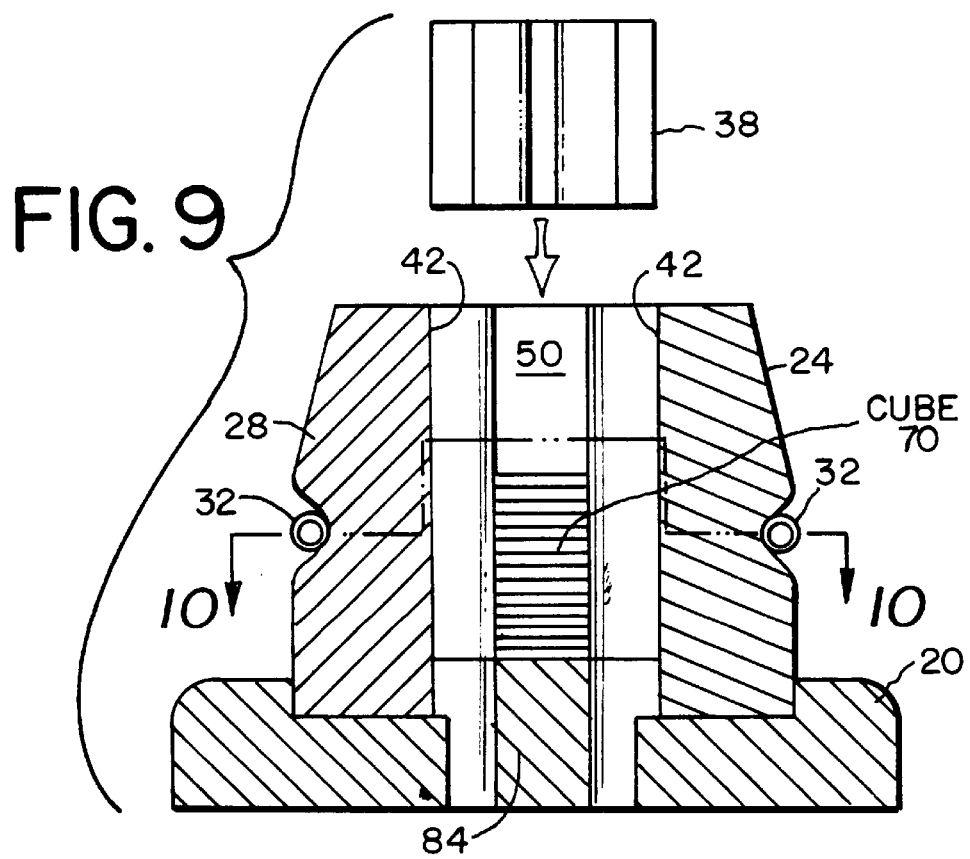
FIG. 9 is an exploded cross section of a fixture having laminated integrated circuit layers positioned within the fixture.

Laminated integrated circuit devices are usually rectangular. The side body portions 24, 28 include at least one 90° corner portion 62 (FIG. 3). The cube 70 is thereby engaged by each side body portion along two sides. As shown in FIG. 10, a cube 70 of differing dimensions can be accommodated since the side body portions 24, 28 can move outward away from one another and engage the cube 70 at diagonally opposite corners. Three protrusions 54 are shown on each side body portion, however, more or fewer could be provided to firmly engage the cube 70 and to prevent wobble.

The side body portions are retained together by suitable retaining structure, which can be a bolt, clamp, clip or other suitable structure, but preferably is a closed loop 32. The loop 32 can be an elastic material, such as the coiled spring that is shown. The retaining structure can engage the side body portions along a groove 76 that is provided to receive the circular spring or other retaining structure. The side body portions can have tapered edges 78 which taper outwardly and downwardly toward the groove 76, to facilitate the pushing of the circular spring 32 down over the side body portions and into the groove 76.

The retaining structure preferably biases the side body portions 24, 28 inwardly such that the circuit layers are contacted by the inside surfaces of the side body portions, preferably the protrusions 54. This provides vertical alignment of the circuit layers. The side body portions 24, 28 preferably should not contact one another, as this would prevent the side body portions 24, 28 from moving inwardly under the biasing action of the retaining structure in a manner which would apply the aligning force to the circuit layers.

The side body portions 24, 28 rest on base 20. The base 20 preferably has support structure for the side body portions. The support structure can be of any suitable design, but preferably includes a depression 80 formed at a top surface of the base 20, into which bottom edge portions of the side body portions 24, 28 fit to help to position these pieces. In a preferred embodiment, the support structure also includes upwardly extending structure 84. The upwardly extending structure 84 includes upwardly extending grooves 88 which are adapted to receive the protrusions 54 of the side body portions 24, 28. It is preferable that the grooves 88 are somewhat bigger than the protrusions 54 so as to permit some sideways movement within the grooves 88, and corresponding movement of the side body portions 24, 28. This movement will accommodate different sizes of integrated circuit layers. Holes 92 can be provided in the base 20 for lifting and moving the fixture. The holes 92 are intended to receive the tongs of a lifting device. Additional holes 96 can be provided to receive and ground thermocouple fittings, which are used to measure the temperature of the cube and fixture.

The cap 38 is intended to fit into the open interior space 50 between the inside surfaces 42 of side body portions 24, 28. The cap 38 rests on top of the stacked laminated integrated circuit layers to apply a slight pressure which will keep them from moving. Also, during the curing process a force can be applied to the cap 38 by a mechanical press device, and the cap 38 acts to distribute this force across substantially the entire cross-sectional area of the cube to avoid damage to the circuit layer. Further, where conductive heat is applied, the heat can be transmitted through the cap to avoid direct contact between the heating element and the cube 70.

The cap 38 can have side edge portions which define vertically oriented grooves 100 which are intended to receive the vertically oriented protrusions 54 of the side body portions 24, 28. The protrusions 54 are preferably in the shape of tongues, and the grooves 100 are somewhat larger than the protrusions 54. This permits some sideways movement of the side body portions relative to the cap 38 and to each other, but the cap 38 and base 20 thereby act together to keep the side body portions from moving substantially away from one another. The tongue and grooves each have respective narrowed neck portions 93, 95 which prevent sideways movement of the protrusions 54 out of the grooves 100.

The base 20, side body portions 24, 28, and cap 38 can be formed from any suitable material capable of withstanding temperature and pressure. In a preferred embodiment, the fixture pieces are made from a material which is heat stable and has approximately the same coefficient of thermal expansion as does the circuit layers. This will help to prevent thermal stresses between the fixture and the circuit layers. A currently preferred material is Kovar™, a controlled expansion alloy manufactured by Scientific Alloys Inc. of Westerly, R.I. This material is, by volume, 0.02% carbon, 0.30% manganese, 0.20% silicon, 29.0% nickel, 17.0% cobalt, and the balance iron. The circular spring is preferably made from Inconel 600, a nickel alloy that is, by volume, 76.0% nickel, 2.5% copper, 8% iron, 15.5% chromium, 0.25% silicon, 0.5% manganese, and 0.08% carbon. The dimensions of the components of the fixture can be varied according to the dimensions of the cubes that are being processed.

In operation, the side body portions 24, 28 are set on end in the depression 80 of the base 20, with the protrusions 54 positioned in the upwardly extending grooves 88. The circuit layers are stacked on the upwardly extending structure 84 either before or after the side body portions are placed into position. The circular spring 32 is then forced downward over upper surfaces 80 of the side body portions 24, 28, to wedge to circular spring outward as it is pushed downward. The circular spring 32 engages the groove 76 to hold the side body portions firmly in place and against the cube 70. The cap 38 is then positioned such that the grooves 100 receive the protrusions 54 to secure the assembly together. The cube is then cured to form a laminated integrated circuit device. After cooling, the cap 38 and spring 32 are removed such that the side body portions 24, 28 can also be removed to permit access to the cube 70.

Alternative embodiments are possible. One such alternative embodiment is shown in FIG. 11. In this embodiment, the fixture includes a base 120 and four side body portions 124, 126, 128, and 130. A cap 138 can also be provided. Each of the side body portions has a right angle portion and inside faces 142 with protrusions 154. The base 120 can have support structure including a depression 180 and upwardly extending structure 184 with upwardly extending grooves 188. The cube 170 fits into the open interior space 150 formed by the inside surfaces 142 of the side body portions. Engagement portions 190 are provided in the form of outwardly extending protrusions. The engagement portions 190 of adjacent side body portions are juxtaposed and held together by suitable structure such as spring clips 194. The engagement portions 190 can have grooves 198 adapted to receive ends 200 of the spring clips 194. Grooves 208 can be provided in the base 120, in which the engagement protrusions 190 can rest to assist in properly positioning the side body portions.

This invention can be embodied in other specific forms without departing from the spirit or essential attributes thereof, and accordingly, reference should be had to the following claims, rather than to the foregoing specification, for determining the scope of the invention.

What is claimed is:

1. A fixture for making laminated integrated circuit devices from layers of integrated circuits, comprising:
    a base;
    at least two side body portions for substantially enclosing the sides of the laminated integrated circuit layers, said side body portions having inside surfaces for engaging said layers of integrated circuits so as to hold said layers in a desired alignment and having outside surfaces with grooves; and,
    a closed loop of elastic material received in said grooves of said outside surfaces for retaining said side body portions in position so as to hold said layers in said desired alignment.

2. The fixture of claim 1, wherein said closed loop of elastic material comprises a substantially circular spring.

3. A fixture for making laminated integrated circuit devices from layers of integrated circuits, comprising:
    a base;
    at least two side body portions for substantially enclosing the sides of the laminated integrated circuit layers, said side body portions having inside surfaces with substantially vertically elongated protrusions for engaging said layers of integrated circuits so as to hold said layers in a desired alignment; and,
    structure for retaining said side body portions in position so as to hold said layers in said desired alignment.

4. The fixture of claim 3, further comprising a cap for resting on top of said layers of integrated circuits, said cap having side edges with grooves adapted to receive ends of said substantially vertically elongated protrusions so as to retain said cap in a desired position.

5. A fixture for making laminated integrated circuit devices from layers of integrated circuits, comprising:
    at least two side body portions for substantially enclosing the sides of the laminated integrated circuit layers, said side body portions having inside surfaces forming substantially vertically elongated protrusions for engaging said layers of integrated circuits so as to hold said layers in a desired alignment;
    a base having support structure for positioning said side body portions in said desired position, said support structure having substantially upwardly oriented grooves adapted to receive ends of said vertically elongated protrusions; and,
    structure for retaining said side body portions in position so as to hold said layers in said desired alignment.

6. The fixture of claim 5, wherein said upwardly oriented grooves are dimensioned to permit sideways movement of said side body portions.

7. A fixture for making laminated integrated circuit devices from layers of integrated circuits, comprising:
    a base;
    at least two side body portions for substantially enclosing the sides of the laminated integrated circuit layers, said side body portions having inside surfaces for engaging said layers of integrated circuits so as to hold said layers in a desired alignment;
    said side body portions having engagement portions at substantially side ends of the side body portions; and,
    spring clips for securing the adjacent engagement portions of adjacent side body portions in position so as to hold said layers in said desired alignment.

8. The fixture of claim 7, wherein said engagement portions comprise outwardly extending protrusions, and further comprising clips for engaging said protrusions to retain said side body portions in a desired position.

9. A fixture for making laminated integrated circuit devices from layers of integrated circuits, comprising:
    a base;
    at least two side body portions for substantially enclosing the sides of the laminated integrated circuit layers, said side body portions having inside surfaces for engaging said layers of integrated circuits so as to hold said layers in a desired alignment;
    structure for retaining said side body portions in position so as to hold said layers in said desired alignment; and,
    a cap having grooves for engaging portions of said inside surfaces and resting on top of said layers of integrated circuits.

* * * * *